United States Patent [19]

Konishi

[11] Patent Number: 4,672,258
[45] Date of Patent: Jun. 9, 1987

[54] SEMICONDUCTOR LIGHT SOURCE DEVICE IN IMAGE OUTPUT DEVICE

[75] Inventor: Masahiro Konishi, Ashigara, Japan

[73] Assignee: Fjui Photo Film Co., Ltd., Kanagawa, Japan

[21] Appl. No.: 744,266

[22] Filed: Jun. 13, 1985

[30] Foreign Application Priority Data

Jun. 18, 1984 [JP] Japan .................................. 59-123779

[51] Int. Cl.⁴ ............................................ H05B 33/02
[52] U.S. Cl. ...................................... 313/15; 313/500; 346/108
[58] Field of Search ....................... 313/500, 15; 355/4, 355/14 E, 30; 346/107 R, 108

[56] References Cited

U.S. PATENT DOCUMENTS

| 3,438,057 | 4/1969 | Neitzel | 313/500 X |
| 4,039,890 | 8/1977 | Bailey et al. | 313/500 |
| 4,432,635 | 2/1984 | Mayer | 355/30 |
| 4,542,388 | 9/1985 | Harada | 346/108 X |

Primary Examiner—Palmer C. DeMeo
Assistant Examiner—Sandra L. O'Shea
Attorney, Agent, or Firm—Wenderoth, Lind & Ponack

[57] ABSTRACT

As the amount of light from the semiconductor light source varies depending on the temperature, the amount of exposure varies correspondingly, resulting in a grave defect that the color of the finished image will become uneven in density, tone, etc. According to the present invention, there is provided a semiconductor light source device in an image output device which outputs images by scanning with semiconductor light sources, and which is characterized in that a head block which carries the semiconductor light sources is provided with a temperature sensor and a heater so that the semiconductor light sources can be controlled so as to be kept at a constant temperature.

4 Claims, 3 Drawing Figures

SEMICONDUCTOR LIGHT SOURCE DEVICE IN IMAGE OUTPUT DEVICE

BACKGROUND OF THE INVENTION

The present invention relates to a semiconductor light source device used in an image output device for exposing a photosensitive material to light which will emit a constant amount of light at all times because the temperature of the semiconductor light source is kept at a constant value regardless of variations in the ambient temperature.

FIG. 1 shows one example of a color image output device to which the present invention is applicable. A cylindrical drum 1 rotates about a rotary shaft 2 in the N-direction in the figure for the main scanning operation. A photosensitive material 4 is mounted on the surface of the drum 1. A head block 3 is provided which is opposed to the rotary drum 1 and which carries semiconductor light sources such as a light emitting diode which emit the three primary colors red(R), green(G) and blue(B). The head block 3 is moved in the M-direction in the figure for an auxiliary scanning operation by means of a threaded bar 5 which is threaded through the head block 3, whereby color images are formed on the photosensitive material 4.

FIG. 2 is a graph showing the relation between the electric current and the amount of light emitted from a semiconductor light source. As the temperature rises from t °C. to (t+Δt) °C., the amount of light emitted decreases even if the current remains constant. As the amount of light from the semiconductor light source varies depending on the temperature, the intensity of the exposed image varies correspondingly, resulting in a grave defect that the color of the finished image may become uneven in density, tone, etc.

SUMMARY OF THE INVENTION

An object of this invention is to provide a semiconductor light source which ensures a perfect color control of the finished image from the image output device by controlling the light source as well as its surroundings so that it remains at a constant temperature so as to prevent the amount of light emitted from varying due to changes in the ambient temperature.

According to this invention, in one aspect thereof, for achieving the object described above, there is provided an image output device which outputs images by scanning with a semiconductor light source, which is characterized in that a head block which holds said semiconductor light source is provided with a temperature sensor and a heater so that the semiconductor light source will be controlled so as to remain at a constant temperature.

The nature, principle and utility of the invention will become more apparent from the following detailed description when read in conjunction with the accompanying drawings.

DESCRIPTION OF THE PREFERRED EMBODIMENT

Figure 1:
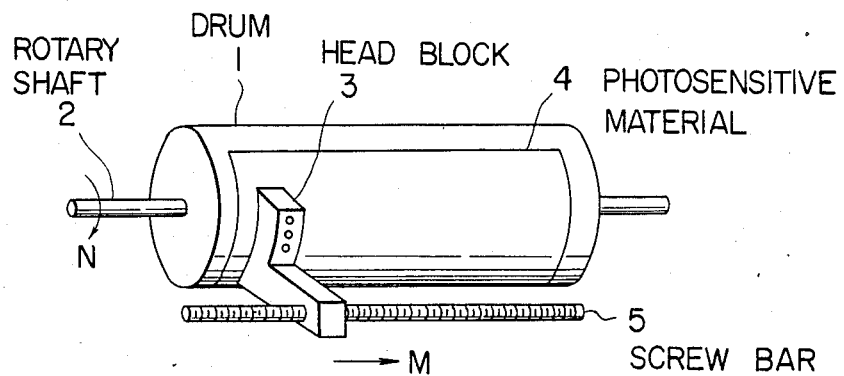
FIG. 1 shows one embodiment of a color image output device to which the present invention is applicable.
Figure 2:
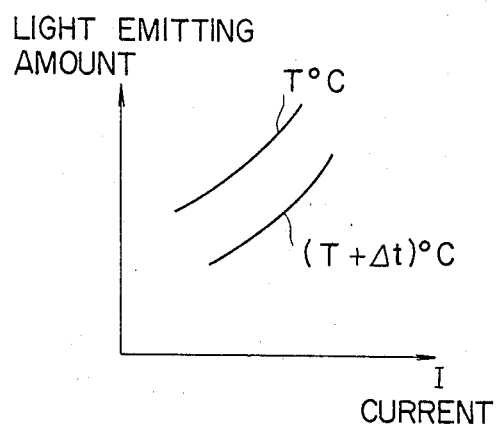
FIG. 2 is a graph to show the relation between the current and the amount of light emitted by the semiconductor light source using the temperature T as a parameter.
Figure 3:
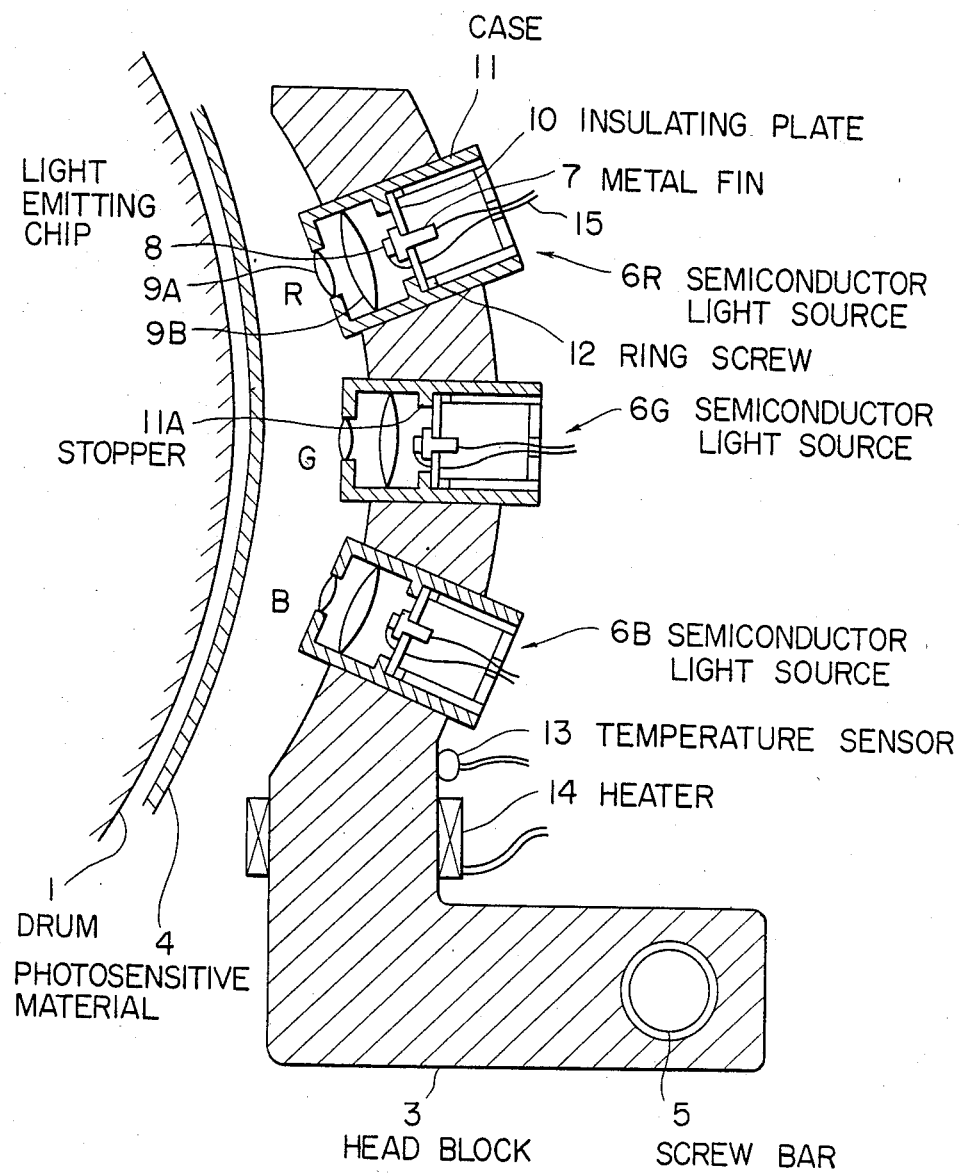
FIG. 3 is a partial sectional view showing one embodiment of the present invention.

According to the present invention, semiconductor light sources 6R, 6G and 6B of identical construction which emit the three primary RGB colors are mounted in alignment on the head block 3. A light emitting chip 8 in each source which emits light of single color is attached to metal fin 7, which is inserted through an insulating plate 10. The insulating plate 10 is fixed to a stopper 11A in a case 11 by means of a ring-shaped screw 12. The metal fin 7 also functions as an electrode. By applying current across lead wires 15 which are connected both to the metal fin 7 and to the light emitting chip 8, light of a predetermined color is caused to be emitted from the light emitting chip 8. Lenses 9A and 9B are provided above the light emitting chip 8 so that the light emitted by the light emitting chip 8 will be focused on the photosensitive material 4 attached to the drum 1. Further, a heater 14 is placed at the lower part of the head block 3 and a temperature sensor 13 for detecting the temperature of the head block 3 is also attached to the head block. The detection signal from the sensor 13 is inputted to a control unit (not shown), and the control unit will actuate the heater 14 to heat the head block 3 to a predetermined temperature.

With the above construction, the temperature to which the head block 3 is to be raised is set at a point which is for example, about 5° C. higher than the maximum ambient temperature in the vicinity of the head block when the device is under the maximum temperature condition. In one example, if the rated temperature of the light sources 6R, 6G and 6B is 6° C., the temperature of the head block 3 can be set at 45° C. assuming that the rated maximum ambient temperature in the vicinity of the image output device will be 40° C. It is therefore necessary for the heater 14 to have a sufficient capacity to maintain such temperature. As the head block 3 is controlled so as to remain at a constant temperature by the heater 14, the semiconductor light sources 6R, 6G and 6B will also be maintained at this temperature. Thus, even if the ambient temperature changes, the temperature of the light sources 6R, 6G and 6B will be kept constant and the amount of light emitted will thereby be kept constant.

In the embodiment discarded above, the heater 14 is provided at a lower part of the head block 3. The heater, however, may be provided at any arbitrary position; it is possible to embed the heater 14 in the head block 3. It should be noted that modifications as to the configuration of the head block or the construction of the semiconductor light sources can also be made so long as the thermal capacity is large enough to absorb the temperature characteristic of the light emitting chip.

As described in the foregoing, this invention can provide a high performance semiconductor light source which can emit light at a constant value irrespective of the fluctuation in ambient temperature, thereby providing images without density or tone fluctuations.

It should be understood that many modifications and adaptations of the invention will become apparent to those skilled in the art it is intended to encompass such obvious modifications and changes in the scope of the claims appended hereto.

What is claimed is:

1. In an image recording device which records images on a photosensitive material, a semiconductor light source device having semiconductor light sources in a head block for exposing a photosensitive material to light from said light sources and including means for scanning said photosensitive material by said semiconductor light sources in the head block, and a temperature sensor and heat control means connected thereto and responsive to the temperature sensed by said temperature sensor and operatively associated with the head block for controlling the temperature of said head block for maintaining the temperature of said semiconductor light sources at a constant temperature by heat flowing through said head block.

2. A semiconductor light source device as claimed in claim 1 in which said heat control means is a heater and control means for controlling said heater for heating said semiconductor light sources to a constant temperature higher than the ambient temperature.

3. A semiconductor light source device as claimed in claim 2 in which said semiconductor light sources are mounted on said head block facing the photosensitive material, and said heater is placed at a position close to said semiconductor light sources on said head block.

4. A semiconductor light source device as claimed in claim 1 in which said semiconductor light sources are three light sources for respectively emitting three primary colors.

* * * * *